(12) United States Patent
Iwase

(10) Patent No.: US 9,922,853 B2
(45) Date of Patent: Mar. 20, 2018

(54) DIE SUPPLY APPARATUS

(71) Applicant: FUJI MACHINE MFG. CO., LTD., Chiryu-shi (JP)

(72) Inventor: Tomonori Iwase, Chiryu (JP)

(73) Assignee: FUJI MACHINE MFG. CO., LTD., Chiryu-shi (JP)

( * ) Notice: Subject to any disclaimer, the term of this patent is extended or adjusted under 35 U.S.C. 154(b) by 100 days.

(21) Appl. No.: 14/648,061

(22) PCT Filed: Dec. 12, 2012

(86) PCT No.: PCT/JP2012/082186
§ 371 (c)(1),
(2) Date: May 28, 2015

(87) PCT Pub. No.: WO2014/091578
PCT Pub. Date: Jun. 19, 2014

(65) Prior Publication Data
US 2015/0303084 A1    Oct. 22, 2015

(51) Int. Cl.
*H01L 21/67* (2006.01)
*H01L 21/673* (2006.01)

(52) U.S. Cl.
CPC .... *H01L 21/67294* (2013.01); *H01L 21/6732* (2013.01); *H01L 21/67144* (2013.01)

(58) Field of Classification Search
CPC .......... H01L 21/6732; H01L 21/67751; H01L 21/67757; H01L 21/67294; H01L 21/67144
See application file for complete search history.

(56) References Cited

U.S. PATENT DOCUMENTS 5,163,802 A    11/1992 Poinelli
5,414,532 A *  5/1995 Akiyama .......... H04N 1/00795
                                              271/145
(Continued)

FOREIGN PATENT DOCUMENTS

DE    10 2011 00676    10/2012
EP    0 412 945 A1    2/1991
(Continued)

OTHER PUBLICATIONS

Office Action issued Aug. 19, 2016 in Japanese Patent Application No. 2014-551786 (submitting English language translation only).
(Continued)

*Primary Examiner* — Glenn F Myers
(74) *Attorney, Agent, or Firm* — Oblon, McClelland, Maier & Neustadt, L.L.P.

(57) ABSTRACT

A magazine lifting and lowering section of a die supply apparatus houses a replaced magazine rack having different specifications. A code display portion marked with identification information ("a magazine rack ID") for each magazine rack is provided in each magazine rack, and a magazine rack ID and specification data related to each magazine rack are associated with each other and are registered in a database of a host computer. When the magazine rack accommodating a wafer expander is housed in the magazine lifting and lowering section, the magazine rack ID is read from the code display portion of the magazine rack by using a reader such that specification data related to the magazine rack corresponding to the magazine rack ID is transmitted to the die supply apparatus, thereby controlling a lifting and lowering operation of the magazine rack performed by a lifting and lowering mechanism.

6 Claims, 8 Drawing Sheets

(56) References Cited

U.S. PATENT DOCUMENTS

| | | | | |
|---|---|---|---|---|
| 5,898,593 | A * | 4/1999 | Baca | G11B 17/221 |
| | | | | 360/92.1 |
| 5,979,739 | A * | 11/1999 | Jin | H01L 21/67144 |
| | | | | 228/4.5 |
| 6,238,283 | B1 * | 5/2001 | Matsuyama | H01L 21/6732 |
| | | | | 414/939 |
| 8,671,923 | B2 * | 3/2014 | Goff | F41B 5/123 |
| | | | | 124/25 |
| 8,945,411 | B2 * | 2/2015 | Iwai | H01L 21/6732 |
| | | | | 216/59 |
| 2004/0108582 | A1 * | 6/2004 | Kim | H01L 21/67144 |
| | | | | 257/678 |
| 2004/0183910 | A1 * | 9/2004 | Shida | H01L 21/67271 |
| | | | | 348/180 |
| 2007/0033827 | A1 * | 2/2007 | Kim | H01L 21/67144 |
| | | | | 34/406 |
| 2007/0227655 | A1 * | 10/2007 | Kajiyama | H01L 21/3043 |
| | | | | 156/345.11 |
| 2007/0231929 | A1 * | 10/2007 | Kajiyama | H01L 21/67092 |
| | | | | 438/6 |
| 2008/0064187 | A1 * | 3/2008 | Brown | B23K 26/03 |
| | | | | 438/464 |
| 2009/0269178 | A1 * | 10/2009 | Trinks | H01L 21/67132 |
| | | | | 414/590 |
| 2012/0235793 | A1 * | 9/2012 | Yi | H01L 21/67294 |
| | | | | 340/10.1 |

FOREIGN PATENT DOCUMENTS

| | | |
|---|---|---|
| JP | 63-16634 A | 1/1988 |
| JP | 07 2306 | 1/1995 |
| JP | 2010 028064 | 2/2010 |
| JP | 2010-28064 A | 2/2010 |
| JP | 2010 129949 | 6/2010 |

OTHER PUBLICATIONS

International Search Report Issued Jan. 22, 2013 in PCT/JP12/082186 Filed Dec. 12, 2012.

Chinese Office Action issue d in Application No. 201280077625.7 dated Dec. 12, 2016 (English translation).

Supplementary European Search Report issued in Application No. EP 12 88 9775 dated Nov. 9, 2015.

European Search Opinion issued in Application No. EP 12 889 775 dated Nov. 9, 2015.

Chinese Office Action issued in Chinese Patent Application No. 201280077625.7 dated Jul. 10, 2017 (English translation).

* cited by examiner

DIE SUPPLY APPARATUS

TECHNICAL FIELD

The present disclosure relates to a die supply apparatus which is configured to be able to house a replaced magazine rack accommodating an expander of a diced wafer.

BACKGROUND ART

Recently, PTL 1 (JP-A-2010-129949) discloses that a die supply apparatus supplying dies is set to a component mounting machine and dies are picked up from an expander of a diced wafer so as to be mounted in a circuit board. In this case, in the wafer expander, an elastic dicing sheet attached with the diced wafer is caused to adhere to a dicing frame including a circular opening portion by using an adhesive or the like, and the dicing sheet is clamped by two of inner and outer expanding rings inside the opening portion of the dicing frame so as to expand (be stretched). In the die supply apparatus disclosed in PTL 1, the dicing frame of the wafer expander is installed on a wafer pallet by using a screw, and the wafer pallet is accommodated in a plurality of stages of slots inside the magazine rack of the die supply apparatus. Then, when the magazine rack is lifted and lowered by a lifting and lowering mechanism and a next wafer pallet to be drawn out from the magazine rack is lifted and lowered to a predetermined drawing-out position, the magazine rack is stopped and the wafer pallet is drawn out from the magazine rack by using a drawing-out mechanism so as to pick up a die on the wafer pallet.

CITATION LIST

Patent Literature

PTL 1: JP-A-2010-129949

SUMMARY

Technical Problem

Incidentally, a wafer expander provided by the manufacturer and the distributor of the wafer expander is not installed in a wafer pallet. Therefore, when accommodating the wafer expander inside a magazine rack, a worker has to install a dicing frame of the wafer expander in the wafer pallet by using a screw. The work takes time, causing a decrease in productivity (the rate of operation of the component mounting machine).

In order to solve the problem, the present disclosure provides a die supply apparatus in which a wafer expander can be simply accommodated inside a magazine rack and productivity can be improved.

Solution to Problem

The inventor has reviewed a configuration in which a wafer expander is accommodated in a slot of a magazine rack without installing a wafer pallet and a die supply apparatus can house a replaced magazine rack which is commercially available. However, since the commercially available magazine racks are different from one another in specifications (the number of slots, the pitch of the slot, the manufacturer, and the like), it is necessary that a control device of the die supply apparatus checks the specifications of the magazine rack so as to control a lifting and lowering operation of the magazine rack.

According to the present disclosure, there is provided a die supply apparatus including a magazine rack that is provided with a plurality of stages of slots for accommodating a wafer expander in which a dicing sheet attached with a diced wafer expands in a dicing frame, a magazine lifting and lowering section that houses the magazine rack, and a lifting and lowering mechanism that lifts and lowers the magazine rack housed inside the magazine lifting and lowering section. When the magazine rack inside the magazine lifting and lowering section is lifted and lowered by the lifting and lowering mechanism and a next wafer expander to be drawn out from the magazine rack is lifted and lowered to a drawing-out position, the magazine rack is stopped and the wafer expander is drawn out from the magazine rack so as to pick a die up from the wafer expander. The magazine lifting and lowering section is configured to be able to house a replaced magazine rack having different specifications. The die supply apparatus further includes a magazine rack ID record portion which is provided in the magazine rack and in which identification information (hereinafter, referred to as "a magazine rack ID") of the magazine rack is stored or marked, magazine rack information registration means for registering the magazine rack ID and specification data related to the magazine rack which are associated with each other, magazine rack ID reading means for reading the magazine rack ID from the magazine rack ID record portion, and control means for controlling a lifting and lowering operation of the magazine rack performed by the lifting and lowering mechanism by acquiring the specification data related to the magazine rack corresponding to the magazine rack ID read by using the magazine rack ID reading means, from registration data related to the magazine rack information registration means. Here, as the magazine rack ID record portion, a code label and the like in which the magazine rack ID is marked in a bar code, a two-dimensional code, and the like may be adopted, or an electronic tag (also referred to as an RF tag, a radio tag, an IC tag, an electric wave tag, and the like) in which the magazine rack ID is stored may be adopted.

In this case, since the wafer expander is accommodated inside the magazine rack without installing in a wafer pallet, the wafer expander can be simply accommodated inside the magazine rack. Moreover, since the magazine rack ID is read from the magazine rack ID record portion of the magazine rack by using the magazine rack ID reading means, and the specification data related to the magazine rack corresponding to the magazine rack ID is acquired from a registration data of the magazine rack information registration means, thereby controlling a lifting and lowering operation of the magazine rack, it is possible to use a magazine rack having different specifications.

According to the present disclosure, the magazine rack ID record portion may be provided in the magazine rack. In place thereof, the magazine rack may be provided with the specification data record portion in which the specification data related to the magazine rack is stored or marked, the specification data related to the magazine rack may be read from the specification data record portion by using the specification data reading means, and a lifting and lowering operation of the magazine rack may be controlled through the lifting and lowering mechanism based on the read specification data related to the magazine rack. As the specification data record portion, a code label and the like in which the specification data related to the magazine rack is marked in a bar code, a two-dimensional code, and the like may be adopted, or an electronic tag in which the specification data related to the magazine rack is stored may be adopted, as well. In this case, since the magazine rack ID is not necessary, there is no need to cause the magazine rack ID and the specification data related to the magazine rack to be associated with each other so as to be registered.

According to the present disclosure, an adapter allowing the magazine rack having different specifications to be housed in the magazine lifting and lowering section may be prepared for each type of the magazine racks and the magazine rack can be housed in the magazine lifting and lowering section by attaching the adapter to the magazine rack.

Moreover, the specification data related to the magazine rack used in the present disclosure may include data related to the number of the slots and the pitch of the slot which is data necessary to control a lifting and lowering operation of the magazine rack.

Furthermore, the magazine rack provided by the manufacturer and the distributor of the wafer expander in a state of accommodating the wafer expander may be configured to be able to be used as it is. In this manner, there is no need to reset the wafer expander inside the magazine rack provided by the manufacturer and the distributer of the wafer expander to another magazine rack, thereby saving time and labor.

DESCRIPTION OF EMBODIMENTS

Figure 1:
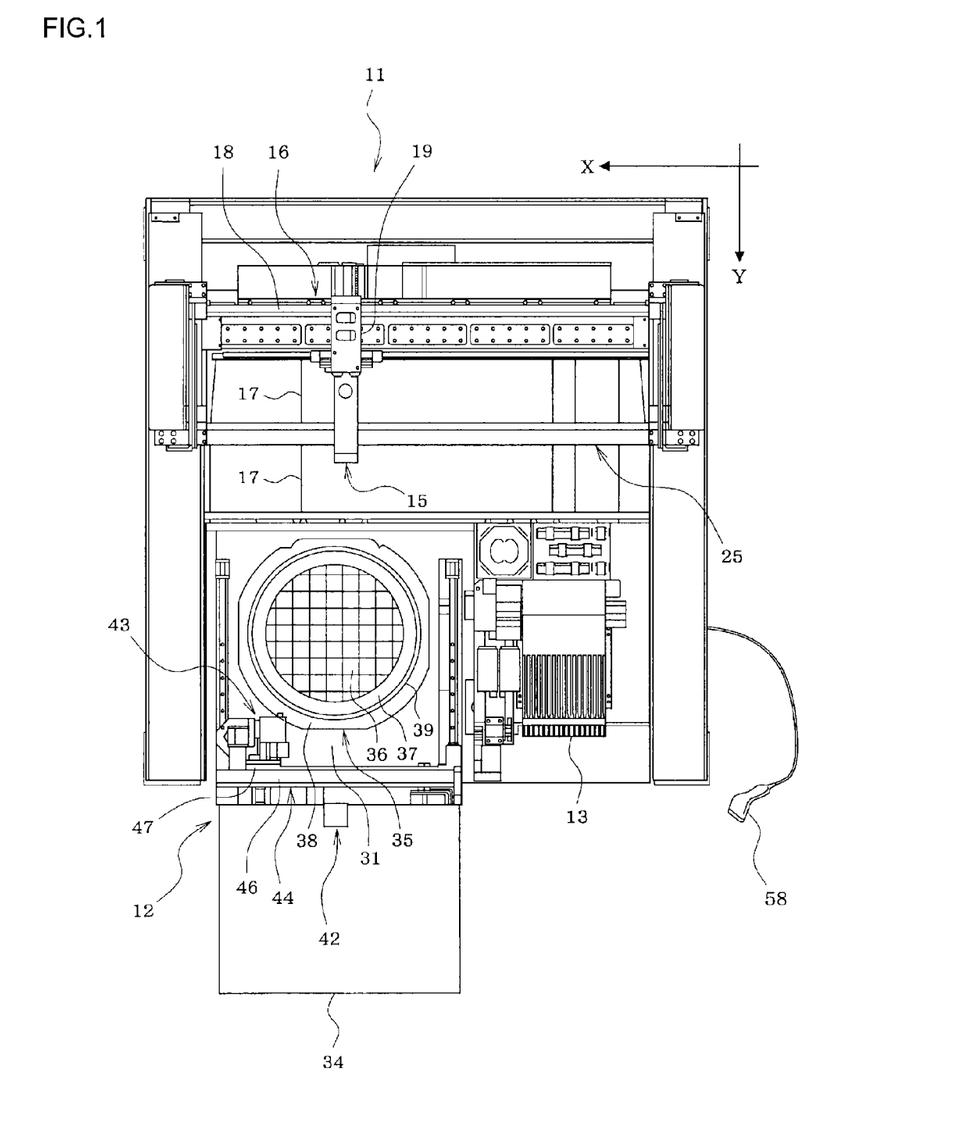
FIG. 1 is a plan view illustrating a state where a die supply apparatus is set in a component mounting machine in an exemplary embodiment of the present disclosure.
Figure 2:
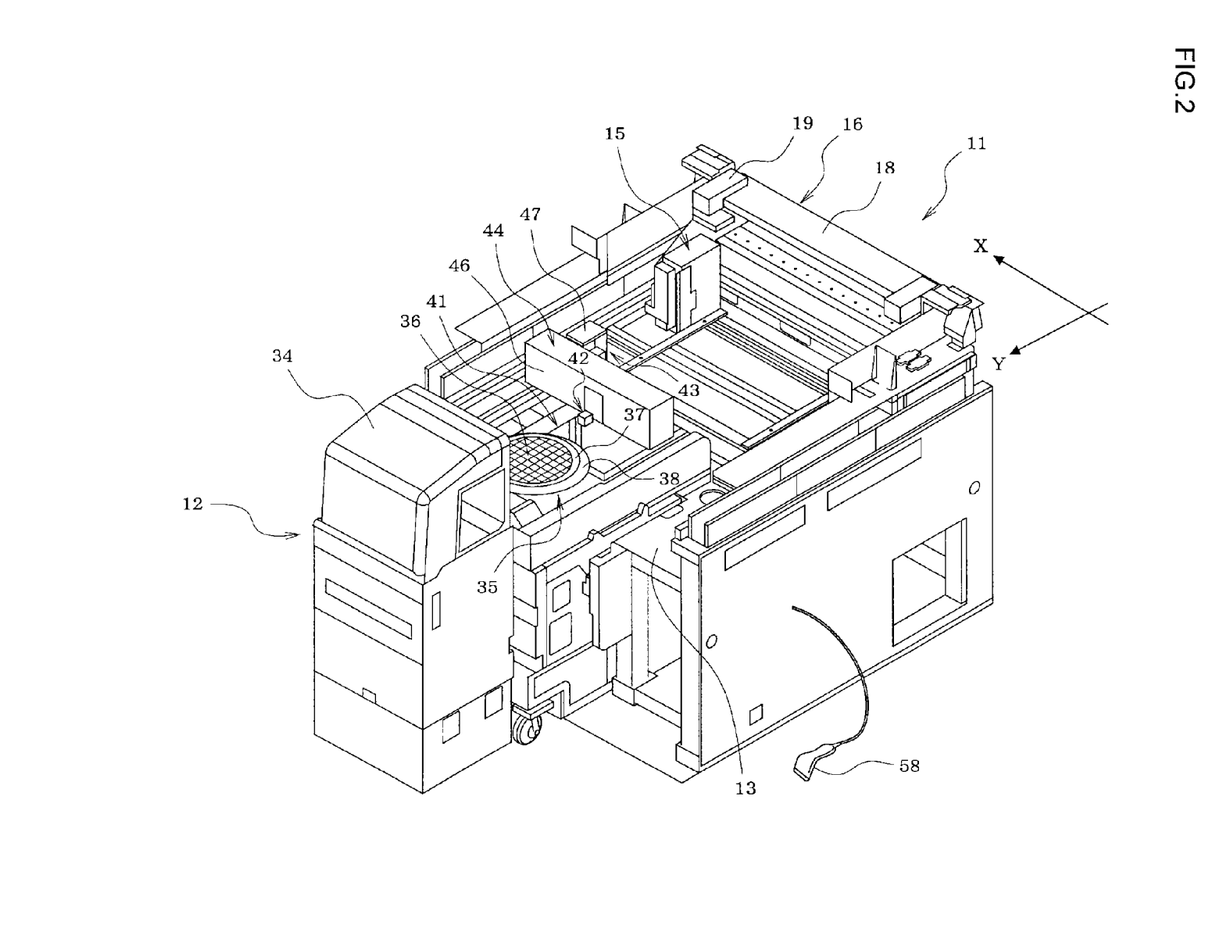
FIG. 2 is a perspective view illustrating the appearance of a state where the die supply apparatus is set in the component mounting machine.

Hereinafter, descriptions will be given regarding an exemplary embodiment in which aspects for realizing the present disclosure is specified. As illustrated in FIGS. 1 and 2, a die supply apparatus 12 is detachably set in a component mounting machine 11. In the component mounting machine 11, a feeder setting table 13 is provided adjacent to a set position of the die supply apparatus 12, and a feeder (not illustrated) such as a tape feeder is detachably set on the feeder setting table 13. The feeder set on the feeder setting table 13 is not limited to the tape feeder. The feeder may be a bulk feeder, a stick feeder, and the like, and multiple types of the feeders among them may be set on the feeder setting table 13.

The component mounting machine 11 is provided with an XY moving mechanism 16 (an XY robot) moving a mounting head 15 in XY-directions (right-left and front-rear directions). The XY moving mechanism 16 includes a Y slide 18 which slides in a Y-direction (a direction perpendicular to a conveyance direction of a circuit board 17) and an X slide 19 which is slidably supported by the Y slide 18 in an X-direction (the conveyance direction of the circuit board 17). The mounting head 15 is supported by the X slide 19.

The mounting head 15 of the component mounting machine is provided with a suction nozzle (not illustrated) adsorbing a die 36 supplied from the die supply apparatus 12 or an electronic component (hereinafter, referred to as "a feeder component") supplied from a feeder, and a mark camera (not illustrated) and the like capturing an imaging target such as a fiducial mark of the circuit board 17 from above.

The component mounting machine 11 is provided with two conveyors 25 for conveying the circuit board 17. A parts camera (not illustrated) capturing the die 36 and the feeder component adsorbed by the suction nozzle of the mounting head 15 from below is provided upwardly at a position between the conveyor 25 and the die supply apparatus 12 (or the feeder).

Figure 8:
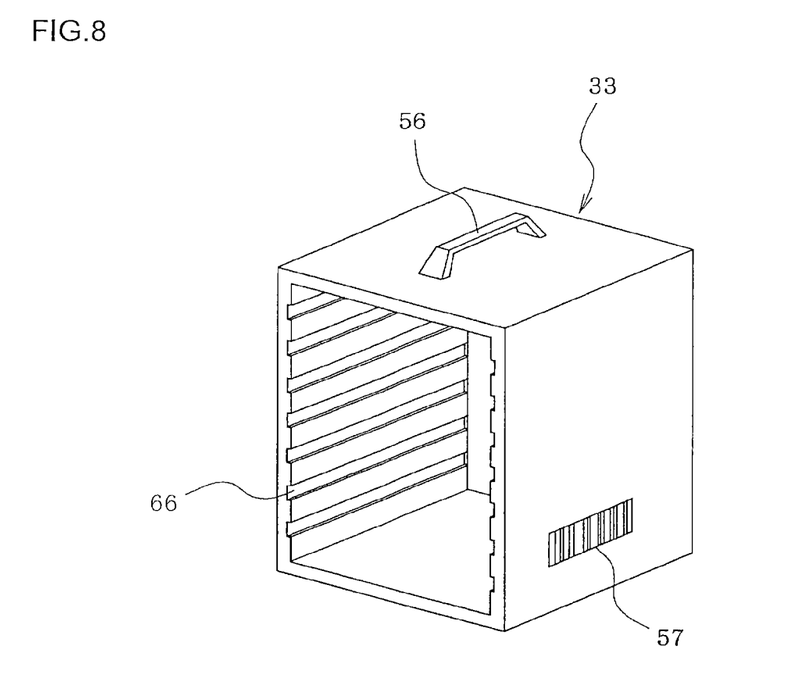
FIG. 8 is a perspective view illustrating an example of a commercially available magazine rack.
Figure 9:
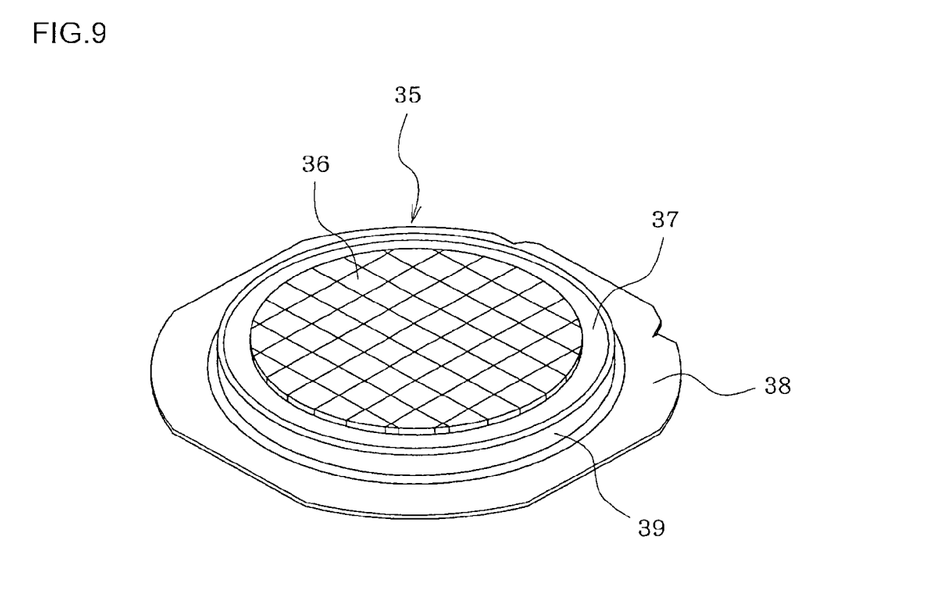
FIG. 9 is a perspective view illustrating a wafer expander.

Meanwhile, the die supply apparatus 12 is provided with a magazine lifting and lowering section 34 which is configured to be able to replace and house magazine racks 31 to 33 (refer to FIGS. 6 and 8) having different specifications. Each of the magazine racks 31 to 33 is provided with a plurality of stages of slots 66 for accommodating a wafer expander 35 (refer to FIG. 9). As illustrated in FIG. 9, in the wafer expander 35, an elastic dicing sheet 37 attached with the diced wafer divided into the multiple dies 36 is mounted in a dicing frame 38 including a circular opening portion by using an adhesive or the like, and the dicing sheet 37 is clamped by two of inner and outer expanding rings 39 inside the opening portion of the dicing frame 38 so as to expand (be stretched).

Figure 4:
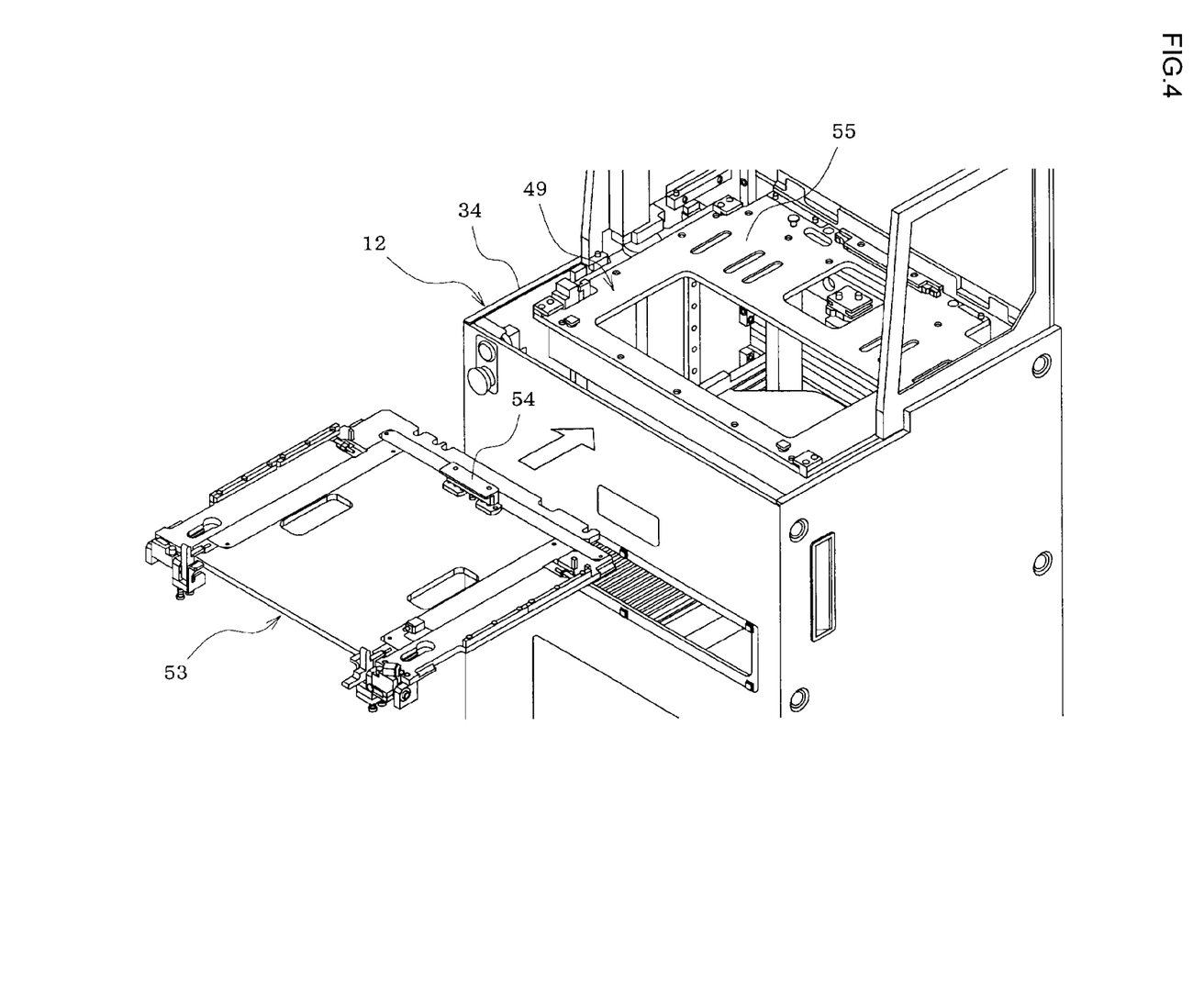
FIG. 4 is a perspective view illustrating work of loading a magazine rack housing adapter in a magazine lifting and lowering section.

The die supply apparatus 12 is provided with a lifting and lowering mechanism 49 (refer to FIG. 4) which lifts and lowers the magazine rack 31 (or 32, or 33) housed inside the magazine lifting and lowering section 34, and is provided with a drawing-out mechanism 42 which draws the wafer expander 35 out from the magazine rack 31 (or 32, or 33) above a stage 41.

The die supply apparatus 12 is provided with an XY moving mechanism 44 (the XY robot) moving a supply head 43 in the XY-directions (the right-left and front-rear directions). The XY moving mechanism 44 includes a Y slide 46 which slides in the Y-direction and an X slide 47 which is slidably supported by the Y slide 46 in the X-direction. The supply head 43 is supported by the X slide 47, and the supply head 43 supports one or a plurality of the suction nozzles (not illustrated) adsorbing the die 36 on the dicing sheet 37, in a vertically movable manner.

While the die supply apparatus 12 is in operation, when the magazine rack 31 (or 32, or 33) inside the magazine lifting and lowering section 34 is lifted and lowered by the lifting and lowering mechanism 49 and the next wafer expander 35 to be drawn out from the magazine rack 31 (or 32, or 33) is lifted and lowered to the drawing-out position, the magazine rack 31 (or 32, or 33) is stopped and the wafer expander 35 is drawn out from the magazine rack 31 (or 32, or 33) above the stage 41 by using the drawing-out mechanism 42 so as to pick up the die 36 from the wafer expander 35 by adsorbing the die 36 with the suction nozzle (or the suction nozzle of the mounting head 15 in the component mounting machine 11) of the supply head 43.

Figure 5:
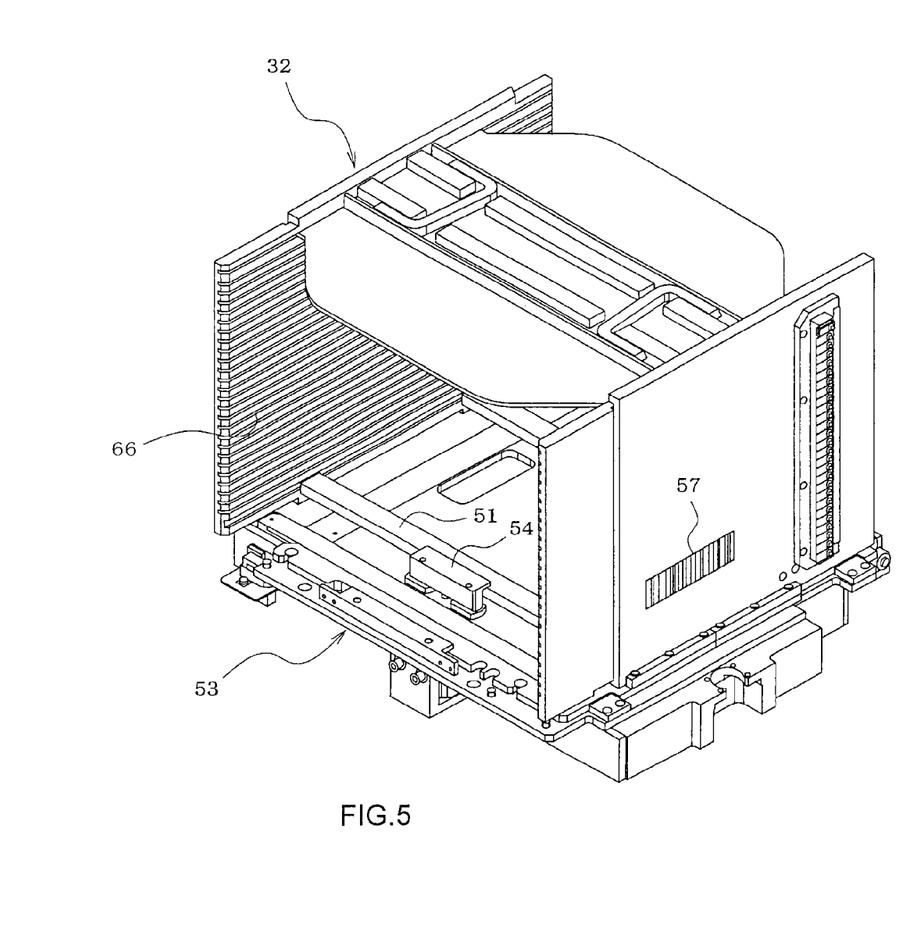
FIG. 5 is a perspective view illustrating a state where a magazine rack is installed in the adapter.
Figure 6A:
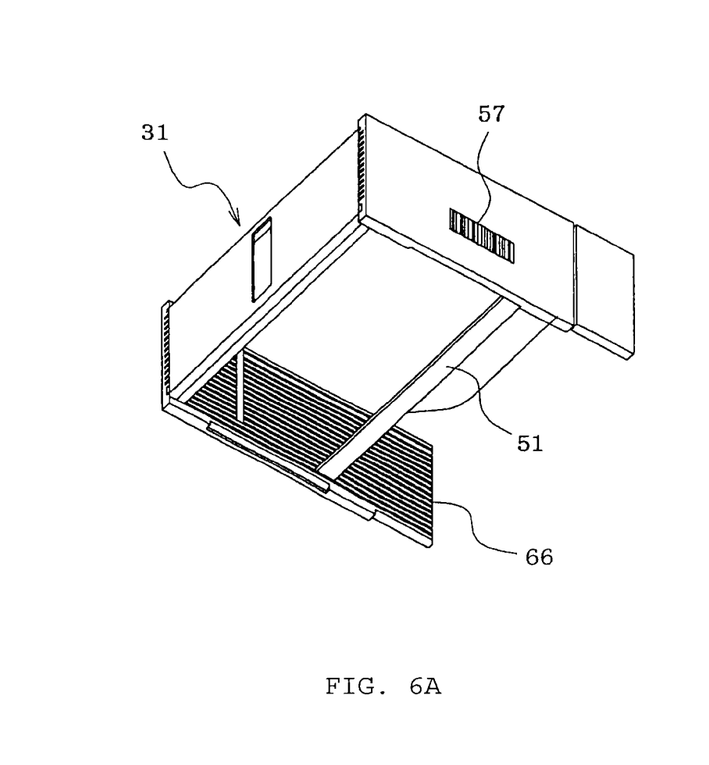
FIGS. 6A and 6B are perspective views illustrating two types of the magazine racks having specifications different from each other.
Figure 6B:
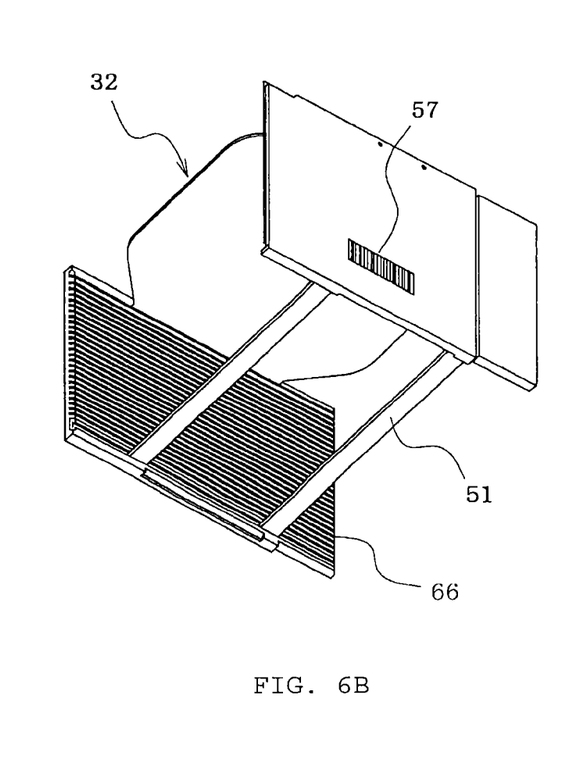
Figure 7A:
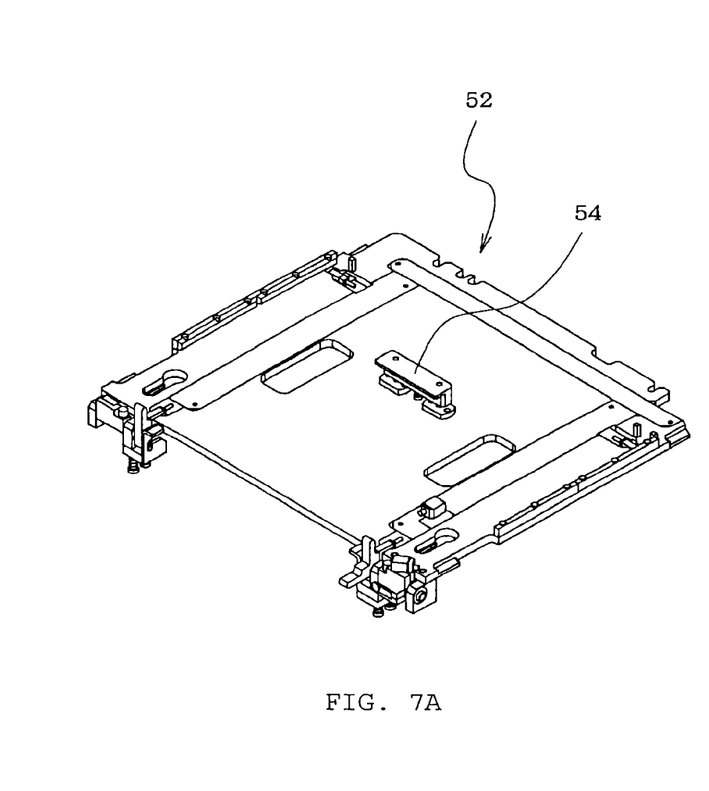
FIGS. 7A and 7B are perspective views illustrating the adapters respectively used in the magazine racks in FIGS. 6A and 6B.
Figure 7B:
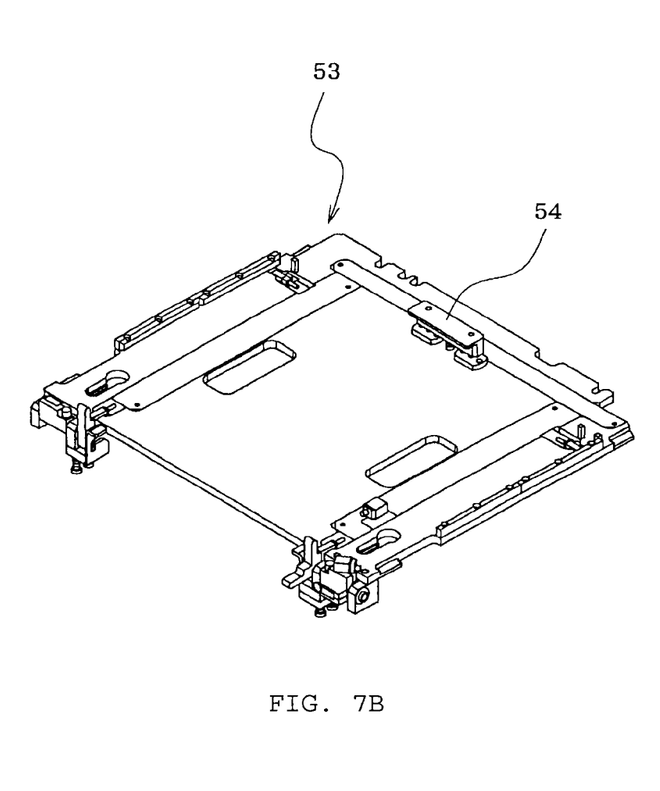

Subsequently, with reference to FIGS. 4 to 8, descriptions will be given regarding a configuration in which the magazine racks 31 to 33 having specifications different from one another can be housed in the magazine lifting and lowering section 34. FIGS. 6A, 6B, and 8 illustrate examples of the magazine racks 31 to 33 having specifications different from one another. The magazine racks 31 and 32 illustrated in FIGS. 6A and 6B are examples of the magazine racks manufactured as accessories of the die supply apparatus 12. The magazine rack 33 illustrated in FIG. 8 is a commercially available magazine rack which is provided by the manufacturer and the distributer of the wafer expander 35 in a state of accommodating the wafer expander 35.

The magazine rack 31 illustrated in FIG. 6A is provided with one clamp bar 51 in the vicinity of the center on the lower face thereof. The magazine rack 32 illustrated in FIG. 6B is provided with two clamp bars 51 in parallel at the front and the rear on the lower face thereof. When the magazine racks 31 and 32 illustrated in FIGS. 6A and 6B are housed in the magazine lifting and lowering section 34, adapters 52 and 53 illustrated in FIGS. 7A and 7B are used. Each of the adapters 52 and 53 is provided with a clamp 54 for clamping the clamp bar 51 in each of the magazine racks 31 and 32. When the magazine rack 31 or 32 is housed in the magazine lifting and lowering section 34, as illustrated in FIG. 5, the clamp bar 51 of the magazine rack 31 or 32 is in a state of being clamped by the clamp 54 of the adapter 52 or 53, thereby being placed on a lifting and lowering table 55 (refer to FIG. 4) of the magazine lifting and lowering section 34.

A grip 56 is provided on the top face of the commercially available magazine rack 33 illustrated in FIG. 8. The commercially available magazine rack 33 can also be housed in the magazine lifting and lowering section 34 by using an adapter (not illustrated).

A side face of each of the magazine racks 31 to 33 is provided with a code display portion 57 displaying a code label and the like in which the magazine rack ID is marked in a bar code, a two-dimensional code, and the like as a magazine rack ID record portion in which identification information (hereinafter, referred to as "a magazine rack ID") for each of the magazine racks 31 to 33 is recorded.

Figure 3:
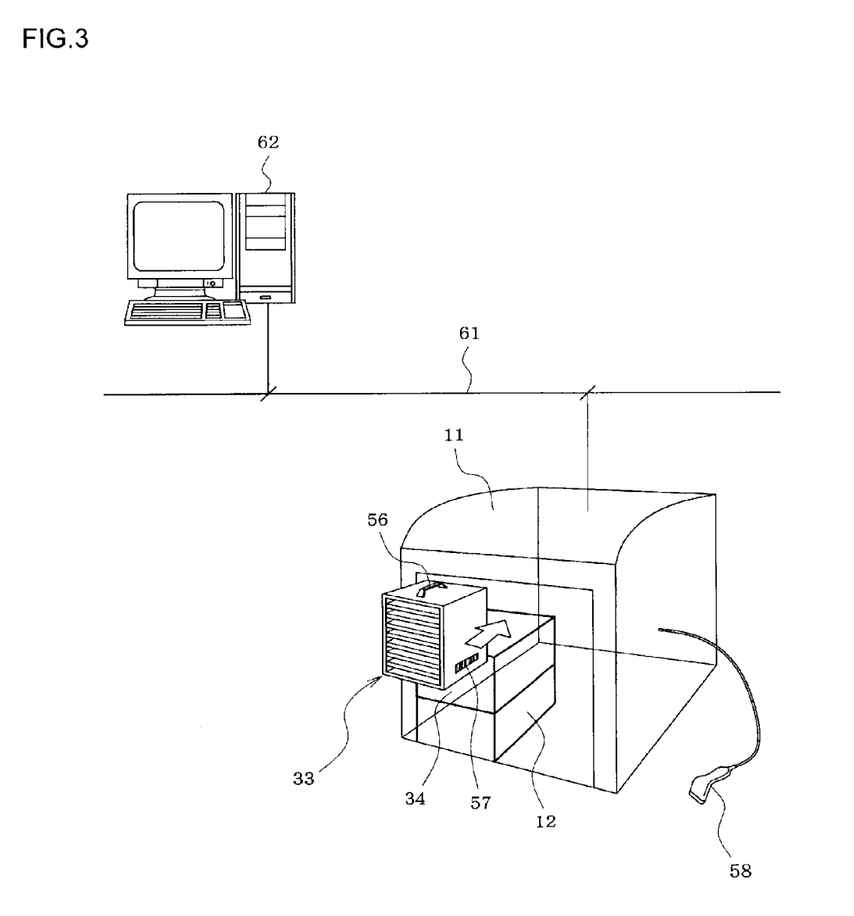
FIG. 3 is a diagram illustrating a configuration of a network of a component mounting line.

Meanwhile, as illustrated in FIG. 3, a reader 58 (magazine rack ID reading means) for reading the magazine rack ID from the code display portions 57 on the side faces of the magazine racks 31 to 33 is connected to the component mounting machine 11. The component mounting machine 11 is connected to a host computer 62 via a network 61. The host computer 62 manages production of multiple apparatuses configuring the component mounting line (the component mounting machine 11, a solder printing apparatus, a reflow furnace, an inspection apparatus, and the like). In a storage device (magazine rack information registration means) of the host computer 62, the magazine rack ID and the specification data related to the magazine racks 31 to 33 are associated with each other so as to be registered. In this case, the specification data to be registered includes, for example, the number of the slots, the pitch of the slot, the size of the wafer expander 35 (the diameter of the wafer), the name of the magazine rack, and the company name of the manufacturer. The specification data to be registered is acceptable as long as at least data of the number of the slots and the pitch of the slot which is the data necessary to control a lifting and lowering operation of the magazine racks 31 to 33 is included.

Subsequently, descriptions will be given regarding the procedure for preparation in which any one of the magazine racks 31 to 33 is housed in the magazine lifting and lowering section 34 of the die supply apparatus 12 so as to be ready for the production thereof.

Previously, the magazine rack ID and the specification data related to the magazine racks 31 to 33 are associated with each other so as to be registered in the storage device (the database) of the host computer 62. In other words, the registration is performed so as to be able to specify the specifications of the magazine racks 31 to 33 through the magazine rack ID.

For example, when the magazine rack 31 illustrated in FIG. 6(a) is selected from the magazine racks 31 to 33 so as to be housed, the wafer expander 35 is accommodated inside the magazine rack 31, and the magazine rack ID is read from the code display portion 57 on the side face of the magazine rack 31 by using the reader 58. The read magazine rack ID is transmitted to the host computer 62 via the control device of the component mounting machine 11. Accordingly, the host computer 62 searches for the specification data information registered in the storage device, outputs the specification data of the magazine rack 31 corresponding to the magazine rack ID, writes a production job including the specification data thereof, and then, the production job is transmitted to the control device (control means) controlling the component mounting machine 11 and the die supply apparatus 12.

The control device of the component mounting machine 11 notifies a worker of the type of the adapter 52 which can clamp the magazine rack 31 designated by the received production job by displaying on a display device (not illustrated). Otherwise, the type thereof may be notified to a worker through audio. As the worker selects the adapter 52 designated through a display on the display device or audio, the adapter 52 is installed in the magazine rack 31 so as to be placed on the lifting and lowering table 55 of the magazine lifting and lowering section 34 and to be ready for the production thereof, thereby completing the preparation.

Thereafter, when the production starts, in the control device of the die supply apparatus 12, a lifting and lowering operation of the magazine rack 31 performed by the lifting and lowering mechanism 49 is controlled based on the specification data related to the magazine rack 31 which is included in the production job transmitted from the host computer 62 via the control device of the component mounting machine 11. Accordingly, when the magazine rack 31 inside the magazine lifting and lowering section 34 is lifted and lowered by the lifting and lowering mechanism 49 and the next wafer expander 35 to be drawn out from the magazine rack 31 is lifted and lowered to the drawing-out position, the magazine rack 31 is stopped and the wafer expander 35 is drawn out from the magazine rack 31 above the stage 41 by using the drawing-out mechanism 42 so as to pick up the die 36 from the wafer expander 35 by adsorbing the die 36 with the suction nozzle (or the suction nozzle of the mounting head 15 in the component mounting machine 11) of the supply head 43.

According to the present exemplary embodiment described above, since the wafer expander 35 is accommodated inside the magazine racks 31 to 33 without installing in the wafer pallet, the wafer expander 35 can be simply accommodated inside the magazine racks 31 to 33. Furthermore, since the magazine rack 33 provided by the manufacturer and the distributor of the wafer expander 35 in a state of accommodating the wafer expander 35 can be used as it is, there is no need to reset the wafer expander 35 inside the magazine rack 33 provided by the manufacturer and the distributor of the wafer expander 35 to another magazine rack, thereby saving time and labor.

Since the magazine rack ID is read from the code display portion 57 of the magazine racks 31 to 33 by using the reader 58, and the specification data related to the magazine racks 31 to 33 corresponding to the magazine rack ID is acquired from the database registered in the storage device of the host computer 62 so as to control a lifting and lowering operation of the magazine racks 31 to 33, it is possible to use the magazine racks 31 to 33 having different specifications from one another.

In the exemplary embodiment, as the magazine rack ID record portion provided in each of the magazine racks 31 to 33, the code display portion 57 displaying a code label and the like in which the magazine rack ID is marked in a bar code, a two-dimensional code, and the like is adopted. However, an electronic tag (also referred to as an RF tag, a radio tag, an IC tag, an electric wave tag, and the like) in which the magazine rack ID is stored may be adopted.

The present disclosure is not limited to a configuration in which the magazine rack ID record portion (the code display portion 57 or an electronic tag) is provided in each of the magazine racks 31 to 33. A specification data record portion in which the specification data related to each of the magazine racks 31 to 33 is stored or marked may be provided in each of the magazine racks 31 to 33, and the specification data related to the magazine racks 31 to 33 may be read from the specification data record portion by using the reader 58 (the specification data reading means), thereby controlling a lifting and lowering operation of the magazine racks 31 to 33 performed by the lifting and lowering mechanism 49 based on the read specification data related to the magazine racks 31 to 33. As the specification data record portion, the code display portion displaying a code label and the like in which the specification data related to the magazine racks 31 to 33 is marked in a bar code, a two-dimensional code and the like may be adopted, or an electronic tag in which the specification data related to the specification data related to the magazine rack is stored may be adopted, as well. In this case, since the magazine rack ID is not necessary, there is no need to cause the magazine rack ID and the specification data related to the magazine racks 31 to 33 to be associated with each other so as to be registered.

In the exemplary embodiment, the reader 58 (the magazine rack ID reading means) which reads the magazine rack ID from the code display portion 57 on the side face of the magazine racks 31 to 33 is connected to the component mounting machine 11. However, the reader 58 may be connected to the die supply apparatus 12 or may be connected to a personal computer for preparatory work connected to the host computer 62, via the network 61. Otherwise, a portable terminal which a worker carries may be caused to function as the reader 58 (the magazine rack ID reading means) so as to transmit the information read by the portable terminal to the host computer 62.

Moreover, it is needless to mention that the present disclosure may be executed by making various changes such as by suitably changing the shape or an attachment method of the magazine racks 31 to 33 or the adapter 52, without departing from the scope of the gist thereof.

REFERENCE SIGNS LIST

11 . . . component mounting machine, 12 . . . die supply apparatus, 13 . . . feeder setting table, 15 . . . mounting head, 17 . . . circuit board, 31 to 33 . . . magazine rack, 34 . . . magazine lifting and lowering section, 35 . . . wafer expander, 36 . . . die, 37 . . . dicing sheet, 38 . . . dicing frame, 39 . . . expanding ring, 42 . . . drawing-out mechanism, 43 . . . supply head, 49 . . . lifting and lowering mechanism, 51 . . . clamp bar, 52, 53 . . . adapter, 54 . . . clamp, 57 . . . code display portion (magazine rack ID record portion), 58 . . . reader (magazine rack ID reading means), 62 . . . host computer, 66 . . . slot

The invention claimed is:

1. A die supply apparatus comprising:
a magazine rack that is provided with a plurality of stages of slots for accommodating a wafer expander in which a dicing sheet attached with a diced wafer expands in a dicing frame;
a magazine lifting and lowering section that houses the magazine rack; and
a lifting and lowering mechanism that lifts and lowers the magazine rack housed inside the magazine lifting and lowering section,
wherein, when the magazine rack inside the magazine lifting and lowering section is lifted and lowered by the lifting and lowering mechanism and a next wafer expander to be drawn out from the magazine rack is lifted and lowered to a drawing-out position, the magazine rack is stopped and the wafer expander is drawn out from the magazine rack so as to pick a die up from the wafer expander,
wherein the magazine lifting and lowering section is configured to be able to house a replaced magazine rack having different specifications, and
wherein the die supply apparatus further comprises:
a magazine rack ID record portion which is provided in the magazine rack and in which identification information (hereinafter, referred to as "a magazine rack ID") of the magazine rack is stored or marked,
circuitry configured to register the magazine rack ID and specification data related to the magazine rack which are associated with each other, the specification data including a number of the slots and a pitch of the slot,
a magazine rack ID reader which reads the magazine rack ID from the magazine rack ID record portion, and
a control device which controls a lifting and lowering operation of the magazine rack performed by the lifting and lowering mechanism based on the number of the slots and the pitch of the slot in the specification data related to the magazine rack corresponding to the magazine rack ID read by using the magazine rack ID reader, from registration data related to the circuitry configured to register the magazine rack ID and specification data related to the magazine rack,
wherein an adapter allowing the magazine rack having different specifications to be housed in the magazine lifting and lowering section is prepared for each type of the magazine racks and the magazine rack can be housed in the magazine lifting and lowering section by attaching the adapter to the magazine rack,
wherein the adapter includes a clamp which cooperates with a clamp bar of the magazine rack, and
wherein the control device is configured to notify an operator of a type of adapter which can clamp the magazine rack.

2. The die supply apparatus according to claim 1, wherein a commercially available magazine rack can be used as the magazine rack.

3. The die supply apparatus according to claim 1,
wherein the control device is configured to notify the operator of the type of adapter which can clamp the magazine rack by displaying on a display device or by audio.

4. A die supply apparatus comprising:
a magazine rack that is provided with a plurality of stages of slots for accommodating a wafer expander in which a dicing sheet attached with a diced wafer expands in a dicing frame;
a magazine lifting and lowering section that houses the magazine rack; and
a lifting and lowering mechanism that lifts and lowers the magazine rack housed inside the magazine lifting and lowering section,
wherein, when the magazine rack inside the magazine lifting and lowering section is lifted and lowered by the lifting and lowering mechanism and a next wafer expander to be drawn out from the magazine rack is lifted and lowered to a drawing-out position, the magazine rack is stopped and the wafer expander is drawn out from the magazine rack so as to pick a die up from the wafer expander,
wherein the magazine lifting and lowering section is configured to be able to house a replaced magazine rack having different specifications,
wherein the die supply apparatus further comprises:
a specification data record portion which is provided in the magazine rack and in which specification data related to the magazine rack is stored or marked, the specification data including a number of the slots and a pitch of the slot,
a specification data reader which reads the specification data related to the magazine rack from the specification data record portion, and
a control device which controls a lifting and lowering operation of the magazine rack performed by the lifting and lowering mechanism, based on the number of the slots and the pitch of the slot in the specification data related to the magazine rack read by using the specification data reader,
wherein an adapter allowing the magazine rack having different specifications to be housed in the magazine lifting and lowering section is prepared for each type of the magazine racks and the magazine rack can be housed in the magazine lifting and lowering section by attaching the adapter to the magazine rack,
wherein the adapter includes a clamp which cooperates with a clamp bar of the magazine rack, and
wherein the control device is configured to notify an operator of a type of adapter which can clamp the magazine rack.

5. The die supply apparatus according to claim 4,
wherein a commercially available magazine rack can be used as the magazine rack.

6. The die supply apparatus according to claim 4,
wherein the control device is configured to notify the operator of the type of adapter which can clamp the magazine rack by displaying on a display device or by audio.

\* \* \* \* \*